United States Patent
Chen et al.

(10) Patent No.: US 8,773,205 B2
(45) Date of Patent: Jul. 8, 2014

(54) DOHERTY POWER AMPLIFIER AND IMPLEMENTATION METHOD THEREOF

(75) Inventors: Huazhang Chen, Shenzhen (CN); Jianli Liu, Shenzhen (CN); Xiaojun Cui, Shenzhen (CN); Bin Duan, Shenzhen (CN)

(73) Assignee: ZTE Corporation, Shenzhen, Guangdong Province (CN)

(*) Notice: Subject to any disclaimer, the term of this patent is extended or adjusted under 35 U.S.C. 154(b) by 0 days.

(21) Appl. No.: 13/513,788

(22) PCT Filed: Oct. 27, 2011

(86) PCT No.: PCT/CN2011/081428
§ 371 (c)(1),
(2), (4) Date: Jun. 4, 2012

(87) PCT Pub. No.: WO2012/146013
PCT Pub. Date: Nov. 1, 2012

(65) Prior Publication Data
US 2014/0035676 A1 Feb. 6, 2014

(30) Foreign Application Priority Data
Apr. 29, 2011 (CN) .......................... 2011 1 0110311

(51) Int. Cl.
*H03F 3/68* (2006.01)
(52) U.S. Cl.
USPC .......................................... 330/295; 330/51
(58) Field of Classification Search
USPC ................ 330/9, 51, 53, 84, 124 R, 286, 295
See application file for complete search history.

(56) References Cited

U.S. PATENT DOCUMENTS 5,548,246 A * 8/1996 Yamamoto et al. ............. 330/51
6,982,593 B2    1/2006 Robinson et al.
(Continued)

FOREIGN PATENT DOCUMENTS

EP    1492228 A1    12/2004
EP    1536556 A2     6/2005
(Continued)

OTHER PUBLICATIONS

International Search Report for PCT/CN2011/081428 dated Dec. 16, 2011.

*Primary Examiner* — Khanh V Nguyen
(74) *Attorney, Agent, or Firm* — Ling Wu; Stephen Yang; Ling and Yang Intellectual Property LLC

(57) ABSTRACT

The present invention discloses a Doherty power amplifier and an implementation method thereof. A peak amplifying circuit of the Doherty power amplifier comprises a radio frequency switching circuit configured to control turn-on of the peak amplifying circuit; wherein a last stage carrier amplifier of a carrier amplifying circuit of the power amplifier uses a HVHBT device, and a last stage peak amplifier of the peak amplifying circuit of the power amplifier uses a GaN device. The present invention avoids the shortcoming when the peak branches in the Doherty power amplifier are turned on ahead of time, decreases power consumption of the peak amplifier and improves the batch efficiency of the whole Doherty power amplifier.

9 Claims, 2 Drawing Sheets

(56) References Cited

U.S. PATENT DOCUMENTS

| | | |
|---|---|---|
| 7,498,878 B2 | 3/2009 | Lim |
| 7,541,866 B2 | 6/2009 | Bowles et al. |
| 7,612,607 B2 * | 11/2009 | Harima .................... 330/124 R |
| 7,928,799 B2 * | 4/2011 | Kusunoki ........................ 330/51 |
| 2004/0263246 A1 | 12/2004 | Robinson et al. |
| 2012/0105147 A1 * | 5/2012 | Harris et al. .................... 330/57 |
| 2012/0235734 A1 * | 9/2012 | Pengelly ................... 330/124 D |

FOREIGN PATENT DOCUMENTS

| | | |
|---|---|---|
| EP | 1898521 A1 | 3/2008 |
| EP | 2159912 A1 | 3/2010 |
| GB | 2437335 A | 10/2007 |
| JP | 2009260472 A | 11/2009 |
| WO | 2006123289 A2 | 11/2006 |
| WO | 2008136124 A1 | 11/2008 |

* cited by examiner

DOHERTY POWER AMPLIFIER AND IMPLEMENTATION METHOD THEREOF

TECHNICAL FIELD

The present invention relates to the field of communication technologies, and more particular, to a Doherty power amplifier and an implementation method thereof.

BACKGROUND OF THE RELATED ART

As the economic idea of the green environmental protection and low carbon is rooted in the hearts of people in the world, operators' requirements for reducing power consumption of wireless communication systems become higher and higher. In a wireless communication system, a radio frequency power amplifier (power amplifier for short) in a base station device is one of core modules of the whole system. An important index of the radio frequency power amplifier is the efficiency of the power amplifier. Data analysis shows that energy consumption of a power amplifier occupies about 60% of total energy consumption in the whole base station device, thus improving the efficiency of the power amplifier becomes the most effective means to reduce power consumption of the base station device and decrease operation expense (OPEX) of operators. Therefore, facing increasingly severe market competition of wireless communications, high efficient radio frequency power amplification technology has become one of competitive focuses of wireless communication industry.

Doherty power amplifier, which is a most widely used high efficient power amplification technology in wireless communication systems currently, is invented by an American electronic engineer named William H. Doherty in 1936. However, in the following about 30 years, people's attention had been diverted. Until the late 1960s, with the development of communication technologies, especially satellite communications, efficiency and linearity issues of power amplifiers were re-proposed in new historical occasions, and Doherty amplifiers came back to people's horizon and were widely applied in communication and broadcast systems in 1970s. At present, the Doherty power amplification technology, used in conjunction with the digital pre-distortion (DPD) technology, has become a mainstream form of high efficient power amplifiers of base stations in wireless communication systems.

The basic idea of the Doherty power amplifier is active load pull. A traditional power amplifier is shown in FIG. 1, which mainly comprises driver stage amplifiers (Dr1 . . . Drn in the figure), a power distributing circuit (D in the figure), a carrier amplifier (C in the figure, also called a main power amplifier), a peak amplifier (P in the figure, also called an auxiliary power amplifier), a power combining circuit (Combiner in the figure), etc. The carrier amplifier operates as a class B or class AB amplifier, and the peak amplifier operates as a class C amplifier. The two amplifiers bear different input signal power and operate in their respective saturation regions as much as possible, thereby guaranteeing that the whole power amplifier maintains higher efficiency in an input signal power range as large as possible, and guaranteeing certain linearity at the same time.

The Doherty power amplifier mainly includes the following three types of operating states.

Small signal area: when input signals are relatively small, the peak amplifier is in an off state, and the carrier amplifier operates as a class AB amplifier, at this point, the carrier amplifier operates in a maximum efficiency matching state.

Load modulation area: when the input signals are increased to a certain extent, a gradual transition of the carrier amplifier from an amplification area to a saturation area appears, and a gradual transition of the peak amplifier from a cut-off area to the amplification area appears, at this point, loads of both the carrier amplifier and the peak amplifier are not stable, and their load impedances vary with variation in power.

Saturation area: with continuous increase in input signals, both the carrier amplifier and the peak amplifier will operate in a saturation state finally and correspond to a load of 50 Ω, and their output powers are added.

CONTENT OF THE INVENTION

A technical problem to be solved by the present invention is to provide a Doherty power amplifier and an implementation method thereof so as to avoid increase in peak power consumption when a peak amplifier is turned on ahead of time while improving efficiency of the whole peak amplifier.

In order to solve the above-mentioned problem, the present invention provides a Doherty power amplifier.

The Doherty power amplifier comprises a peak amplifying circuit and a carrier amplifying circuit, the peak amplifying circuit comprising a radio frequency switching circuit configured to control turn-on of the peak amplifying circuit.

A last stage carrier amplifier of the carrier amplifying circuit uses a high voltage heterojunction bipolar transistor (HVHBT) device, and a last stage peak amplifier of the peak amplifying circuit of the power amplifier uses a gallium nitride (GaN) device.

Alternatively, the peak amplifying circuit comprises one or more peak amplifying branches, the radio frequency switching circuit being configured in each peak amplifying branch.

Alternatively, when the peak amplifying branches are composed of a multistage peak amplifier, the radio frequency switching circuit positioned between a driver stage peak amplifier and a last stage peak amplifier is configured to control turn-off of the last stage peak amplifier in the peak power amplifier branches.

Alternatively, the radio frequency switching circuit comprises a PIN diode radio frequency switch, or a monolithic microwave integrated circuit (MMIC) radio frequency switch.

Alternatively, the radio frequency switching circuit is configured to control turn-of of the last stage peak amplifier by:

turning on the radio frequency switch when input signals of the peak amplifying branches are increased to a turn-on level of the radio frequency switch.

Alternatively, the radio frequency switch further comprises a voltage control port to adjust the turn-on level of the radio frequency switch by changing magnitude of a control voltage of the voltage control port.

The present invention further provides a method for implementing a Doherty power amplifier comprising:

configuring a radio frequency switching circuit in a peak amplifying circuit of the Doherty power amplifier to control turn-on of the peak amplifying circuit.

A last stage carrier amplifier of the carrier amplifying circuit uses a high voltage heterojunction bipolar transistor (HVHBT) device, and a last stage peak amplifier of the peak amplifying circuit of the power amplifier uses a gallium nitride (GaN) device.

Alternatively, the peak amplifying circuit comprises one or more peak amplifying branches, and the step of configuring the radio frequency switching circuit in the peak amplifying circuit of the Doherty power amplifier comprises configuring the radio frequency switching circuit in each peak amplifying branch.

The radio frequency switching circuit comprises a PIN diode radio frequency switch, or a monolithic microwave integrated circuit (MMIC) radio frequency switch.

Alternatively, the step of configuring the radio frequency switching circuit in the peak amplifying circuit of the Doherty power amplifier comprises:

configuring the radio frequency switching circuit between a driver stage peak amplifier and a last stage peak amplifier when the peak amplifying branches are composed of a multistage peak amplifier; and the step of controlling turn-on of the peak amplifying circuit comprises turning on the radio frequency switch when input signals of the peak amplifying branches are increased to a turn-on level of the radio frequency switch, to turn on the last stage peak amplifier.

Alternatively, the method further comprises adjusting the turn-on level of the radio frequency switch by changing magnitude of a control voltage of a voltage control port of the radio frequency switch.

Compared with the prior art, the scheme described above has the following advantages.

a) High efficiency: the shortcoming that the peak branches in the Doherty power amplifier are turned on ahead of time is avoided, the power consumption of the peak amplifier is decreased, and the batch efficiency of the whole Doherty power amplifier is improved. In a Doherty power amplifier in which the scheme described above is not used, power consumption of a peak amplifier generally occupies 10%-20% of total power consumption of the power amplifier. After the scheme described above is used, the power consumption can be decreased to 5%-10%. Meanwhile, since the carrier amplifier uses a HVHBT device, and the peak amplifier uses a GaN (gallium nitride) device, the efficiency is much higher than a LDMOS (laterally diffused metal oxide semiconductor) device, thus the efficiency of the whole power amplifier is improved greatly.

b) Low cost: compared with a scheme which is used by some manufacturers to improve turn-on time of the peak amplifier using complicated digital and radio-frequency circuits, product cost and production cost of the power amplifier are decreased greatly; the cost of the last stage amplification scheme of HVHBT+GaN is decreased greatly compared with the dual GaN scheme.

c) Small volume: compared with the scheme which is used by some manufacturers to improve turn-on time of the peak amplifier using complicated digital and radio-frequency circuits, the occupied volume is much smaller.

BRIEF DESCRIPTION OF DRAWINGS

Here, the illustrated figures, which form part of the present application, are intended to provide further understanding of the present invention. Exemplary embodiments of the present invention and their description are intended to explain the present invention, and not limit the present invention improperly. In the accompanying figures.

PREFERRED EMBODIMENTS OF THE PRESENT INVENTION

Figure 1:
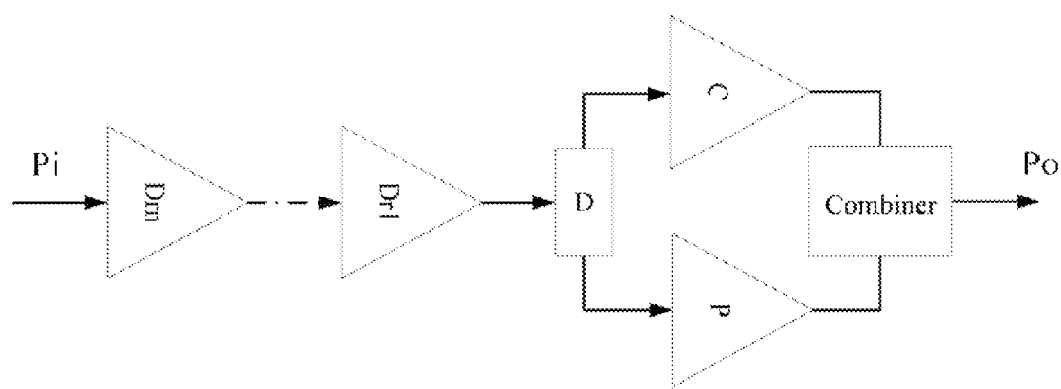
FIG. 1 is a schematic diagram of a traditional Doherty power amplifier.

Operators' requirement for communication systems is that power consumption is as low as possible and efficiency is as high as possible. Therefore, we have to seek constantly a way to further decrease the power consumption and improve the efficiency. The following shortcomings exist in traditional Doherty power amplifiers.

1) Power consumption of a peak amplifier of a Doherty power amplifier is very small in theory, but the power consumption of the peak amplifier actually occupies 10%-20% in the power amplifier. This is because the peak amplifier operates as a class C amplifier in the Doherty power amplifier and is off when small signals are input. When the signals are amplified gradually to a certain extent, a compression trend begins to appear in a carrier amplifier, and at this point it is necessary that the peak amplifier can be turned on and operate normally, otherwise it will influence improvement on linearity of the power amplifier by DPD. The class C amplifier is turned on gradually as the signal changes from small to big, therefore, in practical applications, in order for the peak amplifier to be turned on completely when the carrier amplifier begins the compression, it is necessary that the peak amplifier is turned on ahead of time at a lower level. Thus, the power consumption of the peak amplifier is increased, and the efficiency of the whole power amplifier is decreased.

2) Since both the carrier amplifier and the peak amplifier of the existing Doherty power amplifier use laterally diffused metal oxide semiconductor (LDMOS) power amplifier device, they have shortcomings of low operating frequency, narrow bandwidth, low efficiency, high power consumption, etc.

In an embodiment of the present invention, power consumption of a peak amplifier is reduced by controlling turn-on/off of signals in peak amplifying branches of a Doherty power amplifier. Meanwhile, the efficiency of the whole power amplifier is further increased by selecting device type of the last stage power amplifier.

Specifically, in the embodiment of the present invention, by adding a radio frequency switch to the peak amplifying branches of the Doherty power amplifier, the peak amplifier is turned on only when the radio frequency switch is turned on in the case that the input signal is increased to an appropriate magnitude, thereby preventing the peak amplifier from being turned on ahead of time and further decreasing power consumption of the peak amplifier; meanwhile, the last stage amplifier is implemented using a combination of HVHBT and GaN devices to further improve the efficiency of the whole power amplifier. The high voltage heterojunction bipolar transistor (HVHBT) device refers to a heterojunction bipolar transistor (HBT) device able to operate under a high voltage, including, but not limited to, a Tripower series power amplification device available from Triquint Semiconductor, Inc. The high voltage described above refers to an operating voltage above 12V.

Embodiments of the present invention will be described in detail in conjunction with the accompanying figures hereinafter. It should to be noted that the embodiments of the present application and features in the embodiments can be combined randomly in the case of no conflict.

Figure 2:
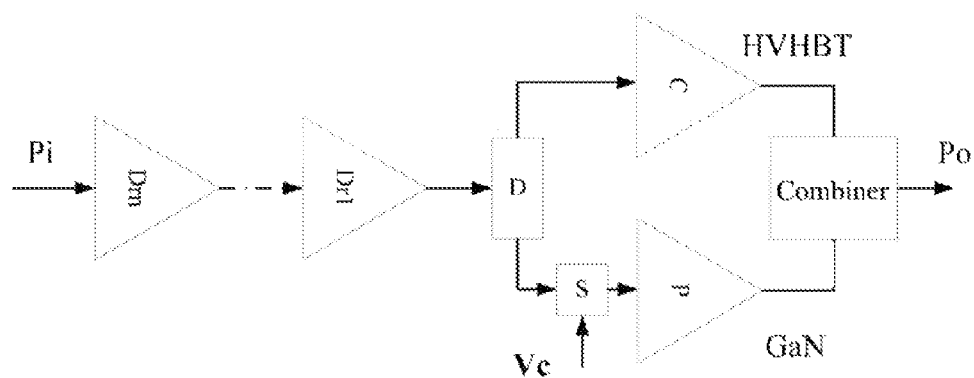
FIG. 2 is a schematic diagram of a 2-way Doherty power amplifier in accordance with an embodiment of the present invention.

FIG. 2 shows a schematic diagram of a 2-way Doherty power amplifier in which the technical scheme of the present invention is applied. In the figure, Pi is an input signal port; Dr1... Drn are driver stage amplifiers; C is a carrier amplifier, P is a peak amplifier, S is a radio frequency switch, Vc is a control voltage of the radio frequency switch (the turn-on level of the radio frequency switch can be adjusted by changing the magnitude of Vc), D is a power splitter circuit, Combiner is a power combining circuit, and Po is a signal output port. The last stage peak amplifier uses a GaN power amplifying device, and the last stage carrier amplifier uses a HVHBT power amplifying device.

Referring to FIG. 2, a procedure in which the peak amplifier is controlled by the radio frequency switch according to an embodiment of the present invention is described below.

When a input signal of a peak amplifying branch is small (less than the turn-on level of the radio frequency switch), the whole peak amplifying branch is in an off state, and at this point the whole carrier amplifying branch operates in a class AB state with maximum efficiency matching.

When the input signal of the peak amplifying branch is increased to a certain extent, a gradual transition of a carrier amplifying branch from an amplifying area to a saturation area begins, and a gradual transition of the peak amplifying branch from a cut-off area to the amplifier area begins, and initially the peak amplifier is not turned on, that is, there is no power consumption. When the signal input into the peak branch reaches the turn-on level of the radio frequency switch, the radio frequency switch is turned on, and the peak amplifier is also turned on completely thereupon. Thus, the peak amplifier is prevented from being turned on ahead of time, the power consumption is decreased, and the efficiency of the power amplifier is improved.

In addition, the turn-on level of the radio frequency switch can be adjusted by changing the magnitude of Vc to meet requirements of signals in different systems and of different peak amplifier devices.

Finally, as the input signal increases constantly, both the whole carrier amplifying branch and the peak amplifying branch will operate in a saturation state finally.

Figure 3:
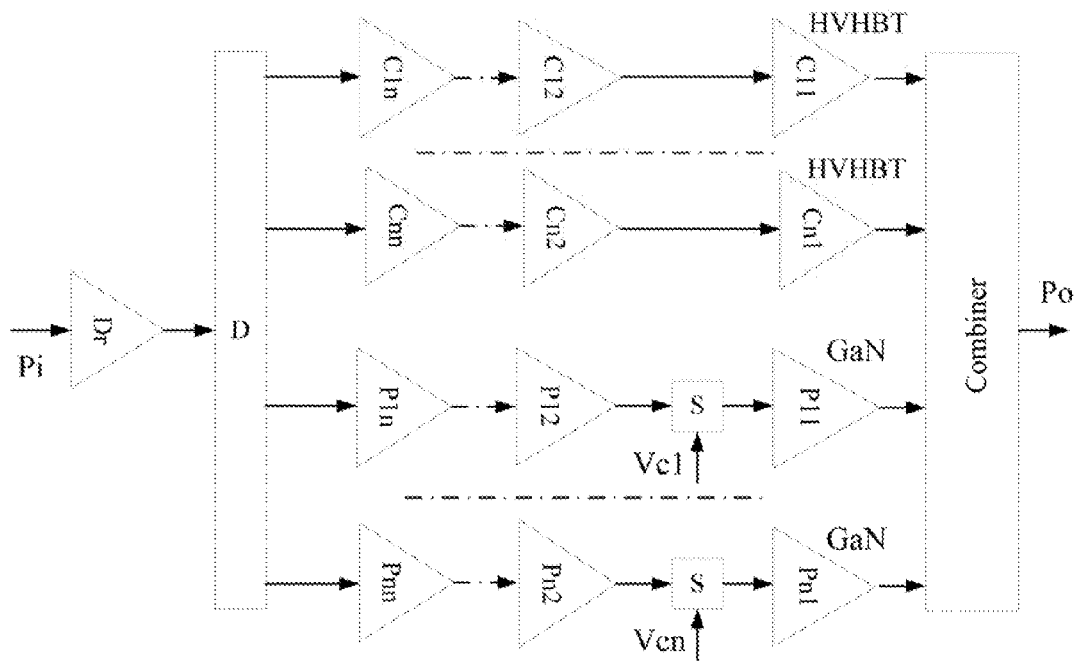
FIG. 3 is a schematic diagram of a multistage and multiway Doherty power amplifier in accordance with an embodiment of the present invention.
Figure 4:
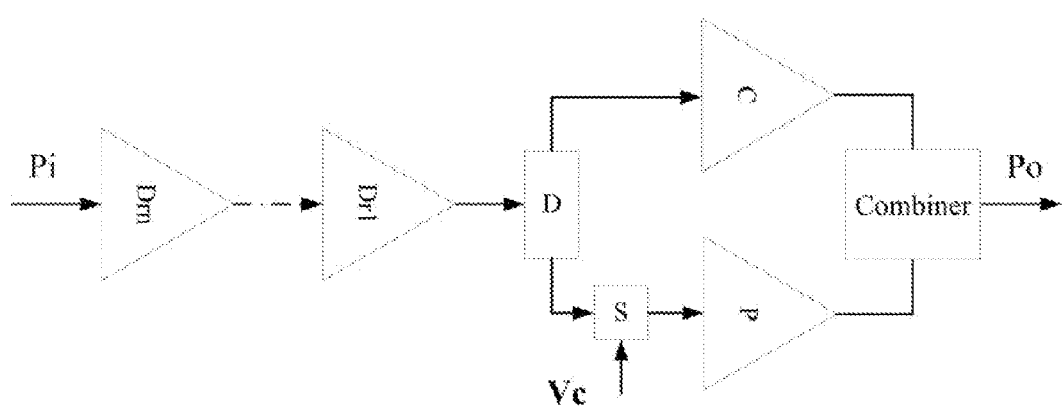
FIG. 4 is a schematic diagram of an 85 W power amplifier applied in UMTS 2.1 GHz frequency band in accordance with an embodiment of the present invention.

A schematic diagram of a multi-way and multistage Doherty power amplifier according to an embodiment of the present invention is shown in FIG. 3. In the figure, Pi is an input signal port; Dr is a driver stage amplifier; D is a power splitter circuit; C11... C1n and Cn1... Cnn compose the first to the $n^{th}$ carrier amplifying branches of a multistage Doherty power amplifier; P11... P1n and Pn1... Pnn compose the first to the $n^{th}$ peak amplifying branches of the multistage Doherty power amplifier; S1... Sn are radio frequency switching circuits of the first to the $n^{th}$ peak amplifying branches, Vc1... Vcn are control voltages of corresponding radio frequency switches (turn-on levels of the corresponding radio frequency switches can be adjusted by changing magnitudes of Vc1... Vcn); and Combiner is a power combining circuit. Principle of performance improvement of this multistage Doherty power amplifier is similar to that of the 2-way Doherty power amplifier.

In addition, an embodiment of the present invention also provides a method for a radio frequency switch to control turn-on/off of a peak amplifier and a method for designing a Doherty power amplifier. For example, main technical requirements of some UMTS power amplifier include a frequency range of 2110 MHz-2170 MHz, output power of 85 W, PAR of a input signal of 7 dB, gain of 50 dB, efficiency of 42%, and linear indexes (including ACPR, SEM, Out of Band Spurious, etc.) meeting standard protocol requirements.

Specifically, the process of finishing research and development of the whole power amplifier using the embodiment of the present invention mainly includes the following steps.

In step A, the form of the power amplifier is determined. Since the output power of the power amplifier is 85 W and the efficiency is required to be more than 42%, comprehensively considering technical index requirements of the power amplifier and the current device condition, it is determined that the whole power amplifier uses a 2-way Doherty power amplifier (such as the 2-way Doherty power amplifier in FIG. 2).

In step B, the type of power amplifying devices of the last stage carrier amplifier (C1) and the last stage peak amplifier (P1) are selected. According to requirements of the output power and PAR of the input signal, HVHBT power amplifying device TG2H214120 available from Triquint Semiconductor, Inc. is selected as the last stage carrier amplifying device, and GaN power amplifying device CGH21240F available from CREE Inc. is selected as the last stage peak amplifying device.

Since the last stage carrier amplifier in the embodiment of the present invention uses the HVHBT power amplifying device and the last stage peak power amplifier uses the GaN device, the efficiency is improved greatly compared with the LDMOS device, and the efficiency of the whole Doherty power amplifier is improved greatly as well.

A main device which influences the performance of the amplifying circuit is the last stage amplifier, thus, in the embodiment of the present invention, improvement is made mainly on the last stage carrier amplifier and the last stage peak amplifier. In addition, when the carrier amplifying branches include the multistage carrier amplifier, the driver stage carrier amplifier thereof can use a HVHBT power amplifying device, or a LDMOS or a GaN device or other devices; when the peak amplifying branches include the multistage peak amplifier, the driver stage peak amplifier thereof can use a GaN power amplifying device, or a LDMOS, or a HVHBT device or other devices.

In step C, the driver stage device is selected. In this example, considering various requirements, CGH40045 of CREE Inc. is selected as the driver stage device, and SXA-389Z of RFMD Inc. is selected as the first stage driver amplifying device.

In step D, design of the radio frequency switching circuit of the peak amplifying branch is completed. The implementation of this circuit includes a PIN diode radio frequency switch, a MMIC radio frequency switch, etc., and it is necessary that the switching circuit can be turned on quickly according to requirements.

In step E, design of remaining circuits, such as a temperature compensation circuit, circulator, coupler, etc., and finally a schematic diagram and PCB design of the whole power amplifier are completed.

In step F, Debugging and testing of the whole power amplifier are completed. The above description is only the preferred embodiments of the present invention and is not intended to limit the present invention. Other various embodiments of the present invention may be possible. Various corresponding modifications and variations to the present invention may be made by those skilled in the art. These modifications and variations should be covered in the protection scope of the appended claims of the present invention.

Obviously, it may be understood by those skilled in the art that all modules or steps in the present invention can be implemented by general-purpose computing devices, and can be integrated into a single computing device or distributed across a network consisting of a plurality of computing devices. Optionally, they can be implemented using program codes executable by the computing devices so as to be stored in storage devices and executed by the computing devices. In addition, in certain cases, the steps illustrated or described may be executed in an order different from that shown herein, or they can be made into various integrated circuit modules, or some modules or steps of them can be made into a single integrated circuit module. Thus, the present invention is not limited to any specific combination of hardware and software.

INDUSTRIAL APPLICABILITY

The embodiments described above have the following advantages.

a) High efficiency: the shortcoming that the peak branches in the Doherty power amplifier are turned on ahead of time is avoided, the power consumption of the peak amplifier is decreased, and the batch efficiency of the whole Doherty power amplifier is improved. In a Doherty power amplifier in which the scheme described above is not used, power consumption of a peak amplifier generally occupies 10%-20% of total power consumption of the power amplifier. After the scheme described above is used, the power consumption can be decreased to 5%-10%. Meanwhile, since the carrier amplifier uses a HVHBT device, and the peak amplifier uses a GaN (gallium nitride) device, the efficiency is much higher than a LDMOS (laterally diffused metal oxide semiconductor) device, thus the efficiency of the whole power amplifier is improved greatly.

b) Low cost: compared with a scheme which is used by some manufacturers to improve turn-on time of the peak amplifier using complicated digital and radio-frequency circuits, product cost and production cost of the power amplifier are decreased greatly; the cost of the last stage amplification scheme of HVHBT+GaN is decreased greatly compared with the dual GaN scheme.

c) Small volume: compared with the scheme which is used by some manufacturers to improve turn-on time of the peak amplifier using complicated digital and radio-frequency circuits, the occupied volume is much smaller.

What we claim is:

1. A Doherty power amplifier comprising a peak amplifying circuit and a carrier amplifying circuit, the peak amplifying circuit comprising a radio frequency switching circuit configured to control turn-on of the peak amplifying circuit;
   wherein a last stage carrier amplifier of the carrier amplifying circuit uses a high voltage heterojunction bipolar transistor (HVHBT) device, and a last stage peak amplifier of the peak amplifying circuit of the power amplifier uses a gallium nitride (GaN) device;
   the peak amplifying circuit comprises one or more peak amplifying branches, the radio frequency switching circuit being configured in each peak amplifying branch;
   when the peak amplifying branch is composed of a multistage peak amplifier, the radio frequency switching circuit positioned between a driver stage peak amplifier and the last stage peak amplifier is configured to control turn-on of the last stage peak amplifier in the peak power amplifier branch.

2. The Doherty power amplifier according to claim 1, wherein
   the radio frequency switching circuit comprises a PIN diode radio frequency switch, or a monolithic microwave integrated circuit (MMIC) radio frequency switch.

3. The Doherty power amplifier according to claim 2, wherein
   the radio frequency switching circuit is configured to control turn-on of the last stage peak amplifier by:
   turning on the radio frequency switch when input signals of the peak amplifying branch where the radio frequency switch is configured are increased to a turn-on level of the radio frequency switch, to turn on the last stage peak amplifier.

4. The Doherty power amplifier according to claim 3, wherein
   the radio frequency switch further comprises a voltage control port to adjust the turn-on level of the radio frequency switch by changing magnitude of a control voltage of the voltage control port.

5. A method for implementing a Doherty power amplifier comprising:
   configuring a radio frequency switching circuit in a peak amplifying circuit of the Doherty power amplifier to control turn-on of the peak amplifying circuit;
   wherein a last stage carrier amplifier of the carrier amplifying circuit uses a high voltage heterojunction bipolar transistor (HVHBT) device, and a last stage peak amplifier of the peak amplifying circuit of the power amplifier uses a gallium nitride (GaN) device;
   the peak amplifying circuit comprises one or more peak amplifying branches, the radio frequency switching circuit being configured in each peak amplifying branch;
   when the peak amplifying branch is composed of a multistage peak amplifier, the radio frequency switching circuit positioned between a driver stage peak amplifier and the last stage peak amplifier is configured to control turn-on of the last stage peak amplifier in the peak power amplifier branch.

6. The method according to claim 5, wherein
   the radio frequency switching circuit comprises a PIN diode radio frequency switch, or a monolithic microwave integrated circuit (MMIC) radio frequency switch.

7. The method according to claim 5, wherein
   the step of controlling turn-on of the peak amplifying circuit comprises turning on the radio frequency switch when input signals of the peak amplifying branch where the radio frequency switch is configured are increased to a turn-on level of the radio frequency switch, to turn on the last stage peak amplifier.

8. The method according to claim 7, further comprising:
   adjusting the turn-on level of the radio frequency switch by changing magnitude of a control voltage of a voltage control port of the radio frequency switch.

9. The method according to claim 6, wherein
   the step of controlling turn-on of the peak amplifying circuit comprises turning on the radio frequency switch when input signals of the peak amplifying branch where the radio frequency switch is configured are increased to a turn-on level of the radio frequency switch, to turn on the last stage peak amplifier.

* * * * *